(12) United States Patent
Lindberg

(10) Patent No.: US 9,312,441 B2
(45) Date of Patent: Apr. 12, 2016

(54) SEMICONDUCTOR CHIP THAT EMITS POLARIZED RADIATION

(75) Inventor: Hans Lindberg, Regensburg (DE)

(73) Assignee: OSRAM Opto Semiconductors GmbH, Regensburg (DE)

(*) Notice: Subject to any disclaimer, the term of this patent is extended or adjusted under 35 U.S.C. 154(b) by 34 days.

(21) Appl. No.: 14/112,000

(22) PCT Filed: Apr. 16, 2012

(86) PCT No.: PCT/EP2012/056910
§ 371 (c)(1),
(2), (4) Date: Dec. 16, 2013

(87) PCT Pub. No.: WO2012/140257
PCT Pub. Date: Oct. 18, 2012

(65) Prior Publication Data
US 2014/0131754 A1    May 15, 2014

(30) Foreign Application Priority Data

Apr. 15, 2011 (DE) .................. 10 2011 017 196

(51) Int. Cl.
*H01L 33/22* (2010.01)
*H01L 33/58* (2010.01)
(Continued)

(52) U.S. Cl.
CPC ............. *H01L 33/22* (2013.01); *H01L 33/58* (2013.01); *H01L 33/60* (2013.01); *H01L 33/10* (2013.01); *H01L 33/46* (2013.01); *H01L 2924/0002* (2013.01); *H01L 2933/0083* (2013.01)

(58) Field of Classification Search
CPC ....... H01L 33/58; H01L 33/385; H01L 33/38; H01L 33/46; H01L 33/22; H01L 33/60; H01L 2933/0083
See application file for complete search history.

(56) References Cited

U.S. PATENT DOCUMENTS 8,031,288 B2    10/2011 Kawamura
8,354,682 B2    1/2013 Eberhard et al.
(Continued)

FOREIGN PATENT DOCUMENTS

DE    102007062041 A1    4/2009
EP         1887634 A2    2/2008
(Continued)

OTHER PUBLICATIONS

"Interference Lithography," AMO GmbH Aachen Interference Lithography, downloaded from: www.amo.de, Nov. 11, 2013, 2 pages.
(Continued)

*Primary Examiner* — Latanya N Crawford
(74) *Attorney, Agent, or Firm* — Slater & Matsil, L.L.P.

(57) ABSTRACT

A semiconductor chip that emits radiation includes a semiconductor body having an active zone, which emits unpolarized radiation having a first radiation component of a first polarization and having a second radiation component of a second polarization. A lattice structure acts as a waveplate or polarization filter and causes an increase in one radiation component relative to the other radiation component in the radiation emitted by the semiconductor chip through an output side. Therefore, the semiconductor chip emits polarized radiation, which has the polarization of the amplified radiation component. The attenuated radiation component remains in the semiconductor chip an optical structure, which converts the polarization of at least part of the attenuated radiation component remaining in the semiconductor chip to the polarization of the amplified radiation component, and a reflective rear side opposite the output side.

17 Claims, 5 Drawing Sheets

(51) Int. Cl.
*H01L 33/60* (2010.01)
*H01L 33/10* (2010.01)
*H01L 33/46* (2010.01)

(56) References Cited

U.S. PATENT DOCUMENTS

| | | | |
|---|---|---|---|
| 2004/0113167 A1* | 6/2004 | Bader et al. | 257/98 |
| 2005/0205884 A1 | 9/2005 | Kim et al. | |
| 2006/0091412 A1 | 5/2006 | Wheatley et al. | |
| 2007/0081253 A1 | 4/2007 | Yamauchi | |
| 2007/0285000 A1* | 12/2007 | Lim et al. | 313/501 |
| 2008/0029336 A1 | 2/2008 | Sigler et al. | |
| 2008/0035944 A1 | 2/2008 | Eberhard et al. | |
| 2008/0054283 A1 | 3/2008 | Min et al. | |
| 2008/0128727 A1* | 6/2008 | Erchak et al. | 257/98 |
| 2008/0290336 A1 | 11/2008 | Park et al. | |
| 2009/0161040 A1 | 6/2009 | Khan et al. | |
| 2010/0127238 A1 | 5/2010 | Kim et al. | |
| 2010/0271566 A1* | 10/2010 | Liao | 349/62 |
| 2011/0198642 A1* | 8/2011 | Kim | 257/98 |
| 2011/0284893 A1 | 11/2011 | Hoeppel et al. | |
| 2012/0012856 A1* | 1/2012 | Chen et al. | 257/76 |
| 2012/0013827 A1* | 1/2012 | Yoon | 349/96 |
| 2012/0223355 A1* | 9/2012 | Asakawa et al. | 257/99 |
| 2012/0299040 A1* | 11/2012 | Kim et al. | 257/98 |
| 2013/0299844 A1* | 11/2013 | Zhao | 257/76 |

FOREIGN PATENT DOCUMENTS

| | | |
|---|---|---|
| JP | 6258600 A | 9/1994 |
| JP | H06258600 A | 9/1994 |
| JP | 2005326575 A | 11/2005 |
| JP | 2006108600 A | 4/2006 |
| JP | 2008047906 A | 2/2008 |
| JP | 2008518464 A | 5/2008 |
| JP | 2009117641 A | 5/2009 |
| JP | 201015126 A | 1/2010 |
| WO | 2009053881 A1 | 4/2009 |
| WO | 2009076939 A2 | 6/2009 |

OTHER PUBLICATIONS

Ahn, S-W., et al., "Fabrication of a 50 nm half-pitch wire grid polarizer using nanoimprint lithography," Institute of Physics Publishing, Nanotechnology, vol. 16, Jul. 22, 2005, pp. 1874-1877.

Kikuta, H., et al., "Achromatic quarter-wave plates using the dispersion of form birefringence," Applied Optics, vol. 36, No. 7, Mar. 1, 1997, pp. 1566-1572.

Schmid, J.H., et al., "Subwavelength grating structures in planar waveguide facets for modified reflectivity," Proc. SPIE 6796, Photonics North, vol. 6796, No. 67963E-1, Oct. 26, 2007, 10 pages.

* cited by examiner

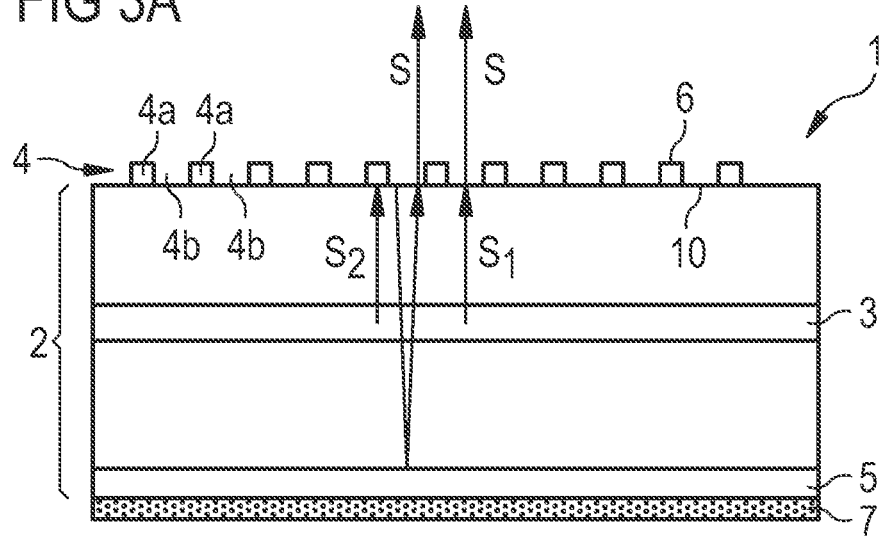
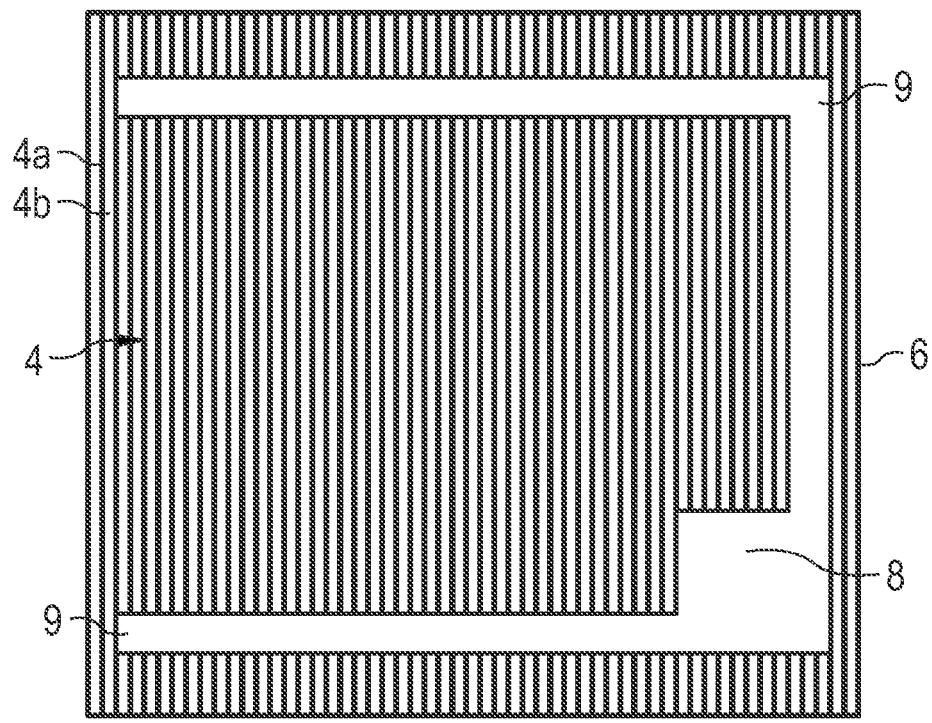

SEMICONDUCTOR CHIP THAT EMITS POLARIZED RADIATION

This patent application is a national phase filing under section 371 of PCT/EP2012/056910, filed Apr. 16, 2012, which claims the priority of German patent application 10 2011 017 196.7, filed Apr. 15, 2011, each of which is incorporated herein by reference in its entirety.

TECHNICAL FIELD

Embodiments of the invention relate to a semiconductor chip that emits polarized radiation.

BACKGROUND

Radiation-emitting semiconductor chips are advantageous light sources owing to their compact size and efficiency. However, on account of spontaneous emission the radiation generated is usually nondirectional and unpolarized. However, for applications such as LCD backlighting, for example, light sources that emit polarized radiation are advantageous.

Both German Patent Publication No. DE 10 2007 062 041 and U.S. Patent Publication No. 2008/0035944 describe radiation-emitting semiconductor chips that emit polarized radiation. Furthermore, they describe that the radiation component which cannot couple out of the semiconductor chip on account of its polarization is at least partly recovered in the semiconductor chip by photon recycling.

SUMMARY OF THE INVENTION

Embodiments of the invention specify a radiation-emitting semiconductor chip that generates polarized radiation in an efficient manner.

In accordance with one embodiment, the radiation-emitting semiconductor chip comprises a semiconductor body comprising an active zone, which emits unpolarized radiation having a first radiation component of a first polarization and having a second radiation component of a second polarization. Furthermore, the radiation-emitting semiconductor chip comprises a grating structure, which acts as a wave plate or polarization filter and brings about an increase in one radiation component relative to the other radiation component in the radiation emitted by the semiconductor chip through a coupling-out side, such that the semiconductor chip emits polarized radiation having the polarization of the amplified radiation component, wherein the attenuated radiation component remains in the semiconductor chip. Furthermore, the radiation-emitting semiconductor chip comprises an optical structure, which converts the polarization of at least part of the attenuated radiation component remaining in the semiconductor chip into the polarization of the amplified radiation component. Furthermore, a reflective rear side is arranged opposite the coupling-out side.

In addition to absorption and reemission processes in the active zone, therefore, the radiation component which remains in the semiconductor chip and which cannot couple out of the semiconductor chip on account of its polarization can be recovered by the change of the polarization by means of the optical structure.

In one configuration of the radiation-emitting semiconductor chip, the grating structure, which is provided for increasing one radiation component relative to the other radiation component in the radiation emitted by the semiconductor chip through a coupling-out side, comprises a plurality of alternately arranged first grating regions of a first material and second grating regions of a second material. In particular, the grating regions of the same material are at a distance from one another which is smaller than a wavelength of the radiation generated by the active zone. Preferably, the distance is chosen such that the grating structure loses its diffraction properties. As a result, the grating structure behaves like a homogeneous medium having a uniform refractive index.

In accordance with one preferred development, the first and second grating regions are embodied in strip-type fashion and are arranged parallel to one another. The width of the first and second grating regions should make up a fraction of the distance at which the grating regions of the same material succeed one another. Such small structures can be produced, for example, by lithographic techniques such as holographic lithography or a nanoimprint method.

In accordance with a first variant, the grating structure acts as a waveplate. In particular, the grating structure in this case corresponds to a birefringent medium. In this case, the radiation component which is polarized parallel to the strip-type grating regions experiences a different effective refractive index than the radiation component which is polarized perpendicular to the strip-type grating regions. Preferably, the first radiation component experiences a different phase shift than the second radiation component upon transmission through the grating structure. By way of example, the thickness of the grating structure can be chosen such that the first radiation component, upon passing through the waveplate twice, experiences a phase shift of $\pi$ (pi), while the second radiation component experiences a phase shift different than $\pi$.

Preferably, the grating structure acting as a waveplate is arranged between the active zone and the reflective rear side of the semiconductor chip. When setting a suitable distance between the active zone and the reflective rear side, account is taken of the total phase shift which the radiation emitted by the active zone and reflected at the rear side experiences between the active zone and the rear side. The distance between the active zone and the reflective rear side is set, in particular, in such a way that as a result of interference of radiation of the same polarization, one radiation component is amplified and the other radiation component is attenuated. By way of example, the distance is set in such a way that the first radiation component interferes constructively in the case of a phase shift of $\pi$, while the second radiation component interferes destructively.

In accordance with one preferred variant, the first radiation component is polarized perpendicular to the strip-type grating regions. Furthermore, the second radiation component is polarized parallel to the strip-type grating regions.

Advantageously, the perpendicularly polarized radiation component is emitted in a perpendicular direction, that is to say perpendicularly to the coupling-out side, while the parallel polarized radiation component is emitted in a horizontal direction, that is to say parallel to the coupling-out side.

Consequently, the semiconductor chip in this variant emits perpendicularly polarized radiation.

In accordance with one preferred embodiment, the first or second grating regions of the grating structure acting as a waveplate are formed from a material that is transmissive to the radiation generated in the active zone. For example, the first or second grating regions can be formed from $SiO_2$, GaAs, AlGaAs, InGaAlP or GaN.

Preferably, the first grating regions are produced by etching a surface of the semiconductor body, such that they are formed from the semiconductor material of the semiconductor body. The second grating regions are gas-filled, in particular air-filled, interspaces between the first grating regions.

Some other transparent filling material, for example, a TCO (Transparent Conductive Oxide) is also conceivable for the second grating regions.

In accordance with a second variant, the grating structure acts as a polarization filter. Preferably, one radiation component is transmitted at the grating structure acting as a polarization filter, and the other radiation component is reflected.

In particular, the first grating regions of the grating structure contain or consist of a metal. The second grating regions can be for example gas-filled, in particular air-filled, interspaces between the first grating regions. By means of the strip-type grating regions that contain or consist of a metal, the radiation component which is parallel polarized is reflected, while the radiation component which is perpendicularly polarized is transmitted.

The first radiation component can be, in particular, perpendicularly polarized, while the second radiation component is parallel polarized.

In accordance with one preferred embodiment, the grating structure acting as a polarization filter is arranged on a surface of the semiconductor body that is on the coupling-out side. In this embodiment, the optical structure is advantageously arranged between that surface of the semiconductor body which is on the coupling-out side and the polarization filter. In particular, the optical structure is in this case embodied as a waveplate.

Alternatively, the grating structure acting as a polarization filter can also be arranged between the active zone and the reflective rear side. In this case, in particular, the parallel polarized radiation component is reflected by the grating structure, while the perpendicularly polarized radiation component is transmitted and reflected by the reflective rear side. If the parallel polarized radiation component is intended to be amplified, in particular the distance between active zone and grating structure is set in such a way that the parallel polarized radiation component interferes constructively. If the perpendicularly polarized radiation component is intended to be amplified, in particular the distance between active zone and reflective rear side is set in such a way that the perpendicularly polarized radiation component interferes constructively.

In one preferred configuration, the grating structure acting as a polarization filter is a contact structure serving for current spreading. In this case, the grating structure is preferably arranged at the coupling-out side of the semiconductor chip, such that the grating structure can be directly electrically contact-connected externally, for example, by means of a contact wire.

The optical structure provided for changing the polarization of the radiation component remaining in the semiconductor chip can be a waveplate, like the grating structure. Furthermore, the optical structure can be a randomly roughened structure or else a predefined structure.

The optical structure is arranged in particular within the semiconductor chip between the coupling-out side and the rear side.

In accordance with one preferred embodiment, the optical structure comprises structured regions extending in a plane arranged parallel to a plane in which the grating structure extends, wherein the structured regions run transversely with respect to the grating regions of the grating structure. The structured regions are therefore not arranged parallel to the grating regions. The structured regions form with the grating regions an angle of greater than 0° and less than 90°. Preferably, the angle is 45°. In this case, the radiation component which remains in the semiconductor chip and which is reflected by the structured regions experiences, in particular, a rotation of the polarization by 90°. Preferably, the structured regions are arranged at least partly parallel to one another.

By way of example, it is possible to embody the optical structure in the manner of the waveplate like a birefringent medium with alternately arranged structured regions having different refractive indexes. Furthermore, the structured regions can be depressions introduced into a semiconductor layer of the semiconductor body. The depressions can be gas-filled, in particular air-filled.

In accordance with a further advantageous embodiment, the optical structure comprises structured regions having oblique side faces which run at an angle of greater than 0° and less than 90°, obliquely with respect to a plane in which the grating structure extends. Preferably, the angle is 45°. The radiation component which remains in the semiconductor chip experiences, in particular, a rotation of the polarization by 90° upon reflection at two opposite side faces of two adjacent structured regions. Preferably, the structured regions are embodied as prisms or pyramids. These can be etched, for example, into a semiconductor layer of the semiconductor chip.

In one preferred configuration, the reflective rear side is provided with the optical structure. By way of example, in this case, a rear-side surface of the semiconductor body can be provided with the optical structure and coated with a reflection layer, such that a reflective rear side having an optical structure is formed as a consequence.

BRIEF DESCRIPTION OF THE DRAWINGS

The radiation-emitting semiconductor chip described here is explained in greater detail below on the basis of exemplary embodiments and the associated figures.

FIG. 3A shows, in a schematic cross-sectional view, a second exemplary embodiment of the radiation-emitting semiconductor chip described herein;

FIG. 3B shows a schematic plan view of the grating structure contained in FIG. 3A;

Elements that are identical, of identical type or act identically are provided with the same reference signs in the figures.

DETAILED DESCRIPTION OF ILLUSTRATIVE EMBODIMENTS

Figure 1A:
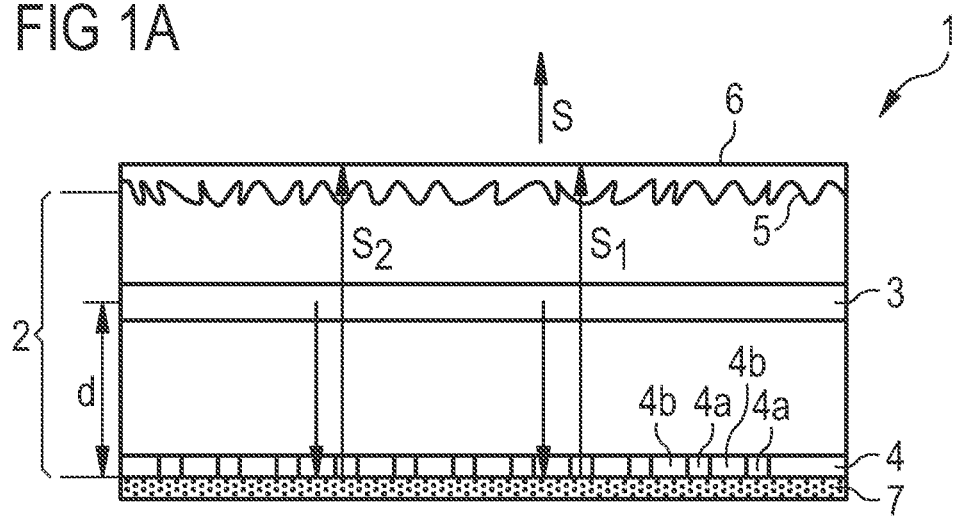
FIG. 1A shows, in a schematic cross-sectional view, a first exemplary embodiment of the radiation-emitting semiconductor chip described herein.

The first exemplary embodiment of a radiation-emitting semiconductor chip 1 as illustrated in FIG. 1A comprises a semiconductor body 2 comprising a plurality of layers formed from a semiconductor material. The semiconductor material can be a nitride- or arsenide-based compound semiconductor, which in the present case means that at least one layer contains $Al_nGa_mIn_{1-n-m}N$ or $Al_nGa_mIn_{1-n-m}As$, where $0 \le n \le 1$, $0 \le m \le 1$ and $n+m \le 1$. In particular, the semiconductor chip 1 is a thin-film semiconductor chip, that is to say that a growth substrate used for producing the semiconductor body 2 is detached or at least greatly thinned.

For the purpose of generating radiation, the semiconductor body 2 comprises an active zone 3. The active zone 3 comprises a pn junction, which in the simplest case is formed from a p-conducting and an n-conducting semiconductor layer, which directly adjoin one another. Preferably, the actual radiation-generating layer, for instance in the form of a doped or undoped quantum layer, is formed between the p-conducting and n-conducting semiconductor layers. The quantum layer can be shaped as a single quantum well (SQW) structure or multiple quantum well (MQW) structure or else as a quantum wire or quantum dot structure. The active zone 3 emits unpolarized radiation having a first radiation component S1 of a first polarization and having a second radiation component S2 of a second polarization.

In order to increase one radiation component S1, S2 relative to the other radiation component S2, S1 in the radiation S emitted by the semiconductor chip 1 through a coupling-out side 6, the semiconductor chip 1 comprises a grating structure 4. In this exemplary embodiment, the grating structure 4 acts as a waveplate. In this case, for the first radiation component S1 upon transmission through the grating structure 4 acting as a waveplate it is possible to obtain a different phase shift than for the second radiation component S2.

The grating structure 4 is arranged between the active zone 3 and a reflective rear side 7. The radiation components emitted in the direction of the reflective rear side 7 therefore pass through the grating structure 4 twice before they reach the coupling-out side 6.

A distance d between the active zone and the reflective rear side 7 is set in such a way that the total phase shift brought about by the distance d and the grating structure 4 leads to constructive interference for one radiation component S1, S2 and to destructive interference for the other radiation component S2, S1, such that one radiation component S1, S2 is amplified and the other radiation component S2, S1 is attenuated. In particular, the grating structure 4 is a $\lambda/4$ plate that leads to a phase shift of $\pi$ for the first radiation component S1. Preferably, the distance d is set in such a way that the first radiation component S1 is amplified and the second radiation component S2 is attenuated. Furthermore, the first radiation component S1 is, in particular, perpendicularly polarized and has a main emission direction in a perpendicular direction, that is to say perpendicularly to the coupling-out side 6. By contrast, the second radiation component S2 is, in particular, parallel polarized and has a main emission direction in a horizontal direction, that is to say parallel to the coupling-out side 6. Consequently, the radiation S emitted by the semiconductor chip 1 is substantially perpendicularly polarized.

In order to change the polarization of at least part of the attenuated radiation component S2, S1 remaining in the semiconductor chip 1 into the polarization of the amplified radiation component S1, S2, the semiconductor chip 1 comprises an optical structure 5. In the exemplary embodiment illustrated in FIG. 1A, the optical structure 5 is a randomly roughened structure. The optical structure 5 can be produced, for example, by etching a semiconductor layer of the semiconductor body 2. Such an optical structure 5 can be situated, as illustrated, within the semiconductor chip 1, or else at a surface of the semiconductor chip 1.

The properties of the grating structure 4 illustrated in FIG. 1A will be explained in greater detail in association with FIGS. 1B, 2A and 2B.

Figure 1B:
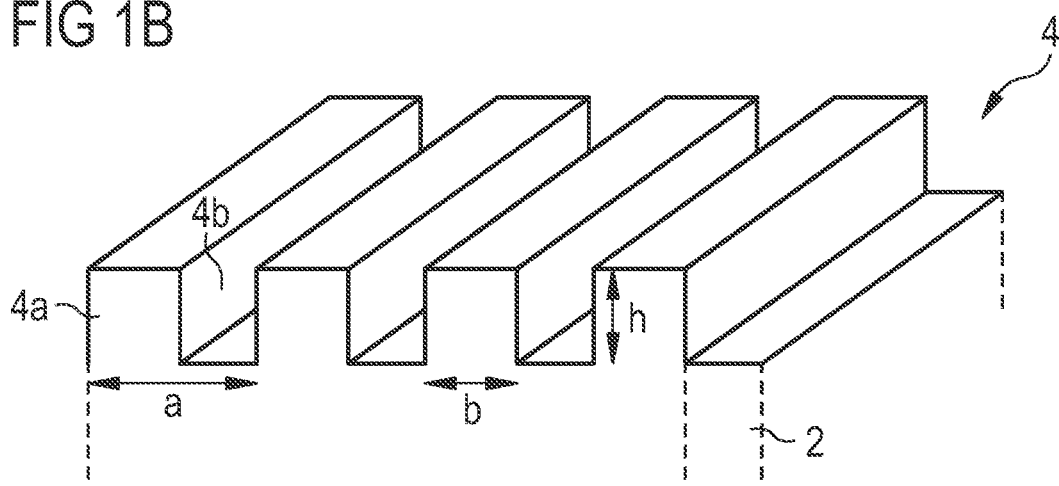
FIG. 1B shows a perspective enlarged view of the grating structure contained in FIG. 1A.

As is illustrated in FIG. 1B, the grating structure 4 comprises a plurality of alternately arranged first grating regions 4a and second grating regions 4b. The first grating regions 4a are formed from a different material than the second grating regions 4b and have a different refractive index. Both grating regions 4a, 4b advantageously contain a radiation-transmissive material. In particular, the first grating regions 4a are formed from the semiconductor material of the semiconductor body 2, for example GaN or GaAs. The second grating regions 4b are interspaces between the first grating regions 4b and can be gas-filled, for example, air-filled, or contain a radiation-transmissive oxide such as $SiO_2$ or a TCO.

In the exemplary embodiment illustrated, the first grating regions 4a are embodied in strip-type fashion. A distance a between two successive first grating regions 4a is smaller than a wavelength of the radiation emitted by the active zone 3. Likewise, a width b of the first grating regions 4a is smaller than the wavelength of the radiation emitted by the active zone 3. Preferably, the same correspondingly applies to the second grating regions 4b. As a result of the small distance a, the grating structure 4 loses its diffraction properties and behaves like a homogeneous medium having a uniform refractive index.

One property of the grating structure 4 illustrated is that radiation which is polarized parallel to the grating regions 4a, 4b experiences a different effective refractive index than radiation which is polarized perpendicularly to the grating regions 4a, 4b. The grating structure 4 has birefringent properties.

Figure 2A:
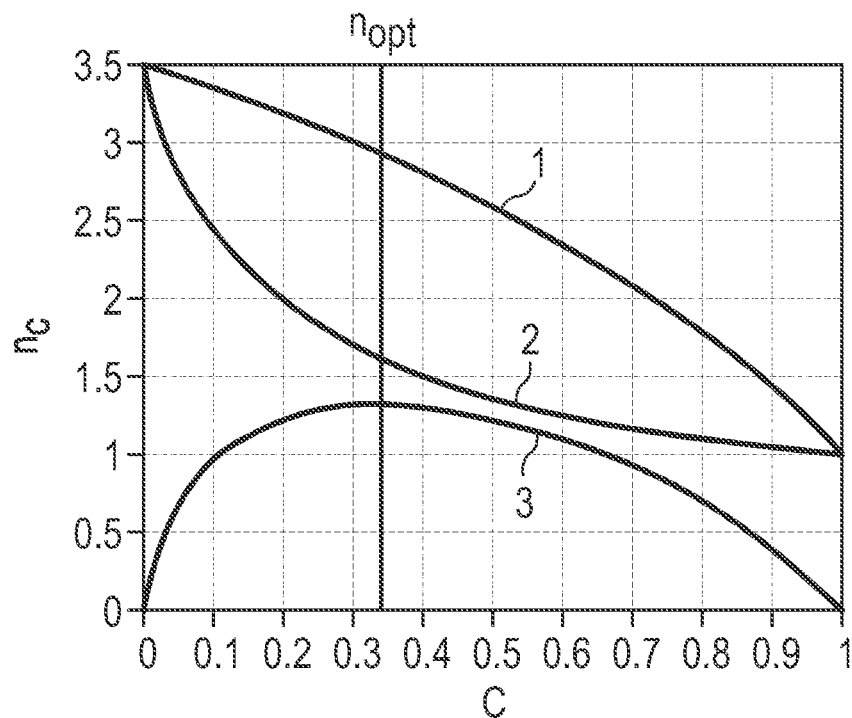
FIGS. 2A and 2B show graphs with values for the effective refractive index and the thickness of a grating structure.

The graph in FIG. 2A illustrates in curve 1 calculated values for the effective refractive index ne of a possible grating structure in a direction parallel to the grating regions and in curve 2 calculated values for the effective refractive index ne of the grating structure in a direction perpendicular to the grating regions. Curve 3 represents the difference between the two curves 1 and 2. The values for the effective refractive index ne are indicated as a function of a variable C, which indicates the ratio of the width b of a first grating region to the distance a between two successive first grating regions. If the width b and the distance a are of the same magnitude (C=0), then the grating structure undergoes transition to an unstructured homogeneous medium formed from a single material. In the exemplary embodiment in FIG. 2A, the first grating regions are formed from GaAs having a refractive index of 3.5. The second grating regions are air-filled interspaces. For C=0, the effective refractive index ne corresponds to the refractive index of the first grating regions, that is to say to the refractive index of GaAs.

For C=1, the effective refractive index ne corresponds to the refractive index of the second grating regions, namely to the refractive index of air. In the case of C=0.33, a maximum difference arises between the effective refractive indexes ne parallel and perpendicular to the grating regions. The two values nopt for the effective refractive indexes ne are taken as a basis for the calculation of a suitable thickness for the grating structure.

Figure 2B:
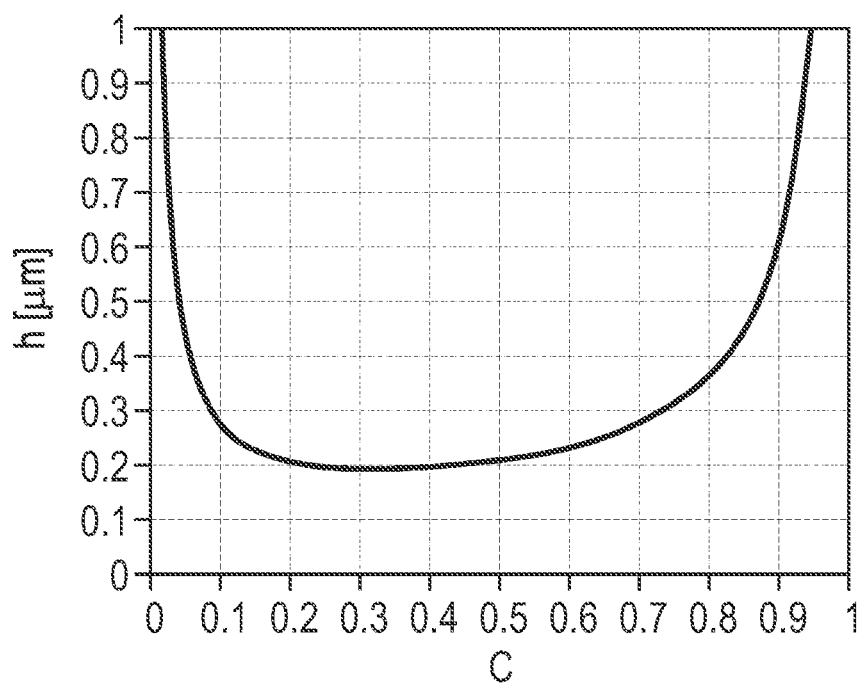

The graph in FIG. 2B shows calculated values for the thickness h of the grating structure as a function of the variable C. For a desired phase shift of $\pi$ for perpendicularly polarized radiation having a wavelength of 1,000 nm, a thickness of h≈0.2 µm arises in the case of C=0.33.

FIG. 3A illustrates a second exemplary embodiment of a radiation-emitting semiconductor chip 1 comprising elements corresponding to the first exemplary embodiment. In contrast to the first exemplary embodiment, the grating structure 4 acts as a polarization filter. In this case, one radiation component S1, S2 is transmitted at the grating structure 4 and the other radiation component S2, S1 is reflected.

In accordance with the second exemplary embodiment, the grating structure 4 comprises first grating regions 4a, which contain a metal or consist thereof. In particular, the first grating regions 4a can be formed from gold. The second grating regions 4b are interspaces between the first grating regions 4a and are gas-filled, in particular air-filled. The first grating regions 4a are embodied in strip-type fashion. By means of the strip-type first grating regions 4a, the radiation component S2 that is parallel polarized is reflected, while the radiation component S1 that is perpendicularly polarized is transmitted.

At a wavelength of 1,000 nm, the distance between the first grating regions 4a is advantageously 200 nm. An advantageous width of the first grating regions 4a is 60 nm in this case.

The grating structure 4 is applied on a surface 10 of the semiconductor body 2 that is on the coupling-out side. The optical structure 5 is arranged on a side of the active zone 3 situated opposite the grating structure 4. Alternatively, the optical structure 5 can be arranged between that surface 10 of the semiconductor body 2 which is on the coupling-out side and the grating structure 4.

In the second exemplary embodiment, the optical structure 5 is embodied in the manner of a waveplate corresponding to a birefringent medium having alternately arranged structured regions having different refractive indexes (not illustrated). The structured regions are embodied, in particular, in a strip-type fashion. The structured regions furthermore advantageously extend in a plane arranged parallel to a plane in which the grating structure 4 extends, wherein the structured regions run transversely with respect to the grating regions 4a and form therewith an angle of greater than 0° and less than 90°, preferably of 45°. As a result, the polarization of the parallel polarized radiation component S2 reflected at the grating structure 4 can be rotated in particular by 90°. The radiation component having the rotated polarization is then perpendicularly polarized and can couple out from the semiconductor chip 1.

The grating structure 4 arranged on a surface 10 on the coupling-out side in the second exemplary embodiment simultaneously serves as a contact structure. As shown by FIG. 3B in a plan view of the semiconductor chip, the grating structure 4 is provided with a contact pad 8 and contact arms 9, which connect the first grating regions 4a to one another. By means of the contact arms 9, the first grating regions 4a can be supplied with current and distribute the current over the entire surface on the coupling-out side.

Figure 4:
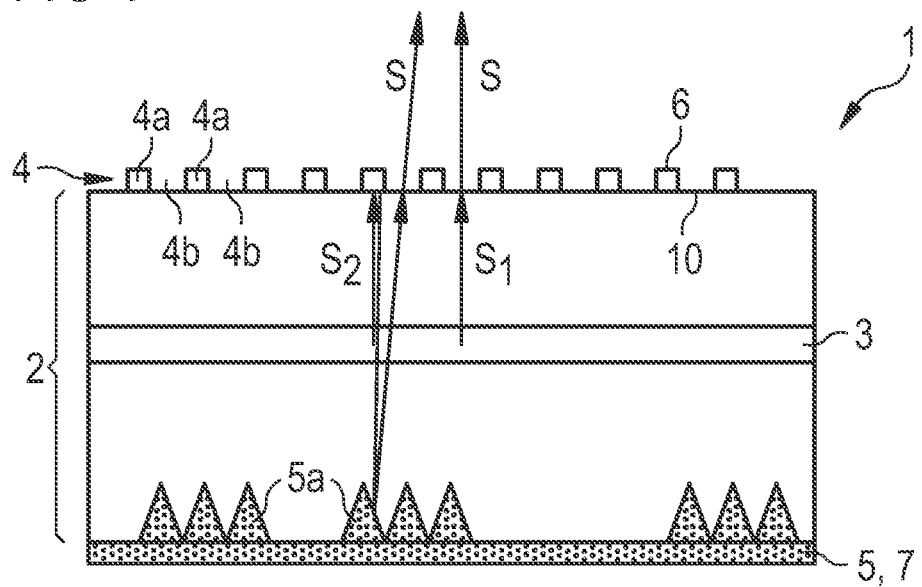
FIG. 4 shows, in a schematic cross-sectional view, a third exemplary embodiment of the radiation-emitting semiconductor chip described herein.

FIG. 4 shows a third exemplary embodiment of a radiation-emitting semiconductor chip 1. In this case, the reflective rear side 7 is provided with the optical structure 5. The optical structure 5 comprises jag-like structured regions 5a suitable for at least partly converting the polarization of the impinging second radiation component S2, which is reflected at the grating structure 4, into the polarization of the first radiation component S1, such that coupling out of the semiconductor chip 1 is possible. For producing the optical structure 5, a rear-side surface of the semiconductor body 2 can be structured and provided with a reflective coating.

Figure 5A:
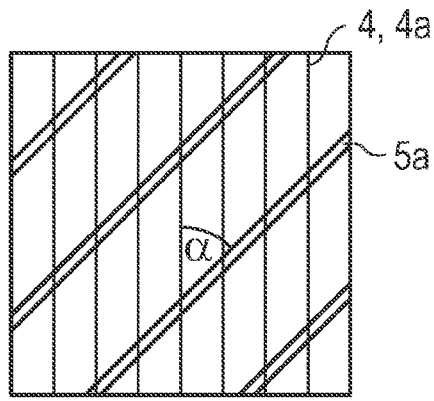
FIGS. 5A, 5B, 6, 7, 8A and 8B show further exemplary embodiments of the optical structure described herein.
Figure 5B:
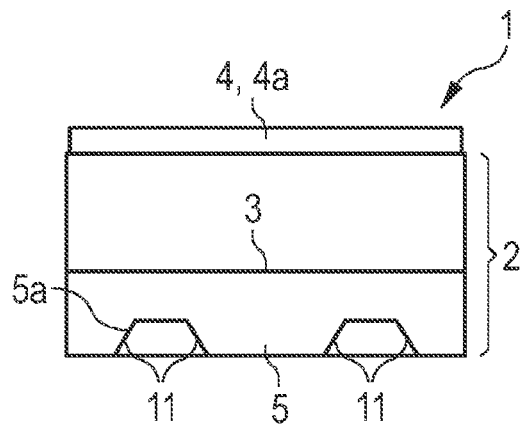

FIG. 5A shows a further exemplary embodiment of an optical structure 5 in a plan view of the semiconductor chip 1. The structured regions 5a are depressions, in particular in the form of elongated trenches, which run parallel to one another. Preferably, the depressions are etched into a rear-side surface of the semiconductor body 2 (cf. FIG. 5B). The structured regions 5a extend in a plane arranged parallel to a plane in which the grating structure 4 extends, wherein the structured regions 5a run transversely with respect to the grating regions 4a and form therewith an angle α of greater than 0° and less than 90°, preferably of 45°. In this exemplary embodiment, the structured regions 5a have inclined side faces 11, wherein the side faces 11 run obliquely with respect to the plane in which the grating structure 4 extends.

Figure 6:
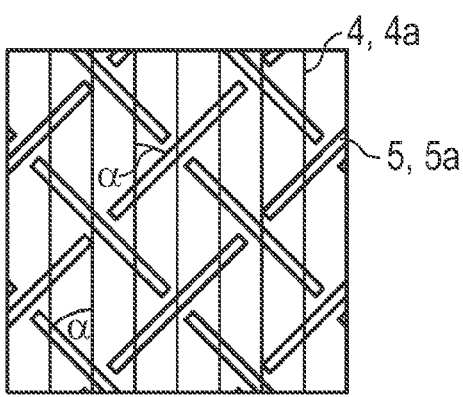
Figure 7:
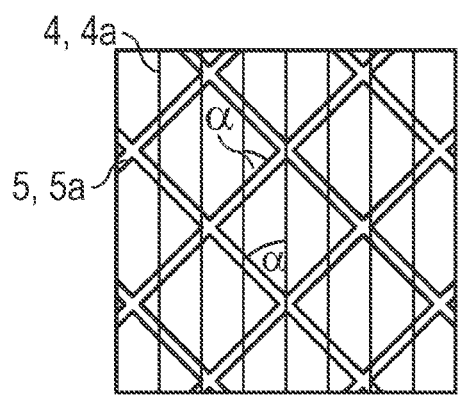

Further exemplary embodiments of an optical structure 5 are shown by FIGS. 6 and 7 in a plan view of the semiconductor chip. In this case, the optical structure 5 comprises a plurality of parallel running structured regions 5a of a first orientation and a plurality of parallel running structured regions 5a of a second orientation. The structured regions 5a of the first orientation run transversely, in particular perpendicularly, with respect to the structured regions 5a of the second orientation. The first grating regions 4a form an angle α of greater than 0° and less than 90°, preferably of 45°, both with the structured regions 5a of the first orientation and with the structured regions 5a of the second orientation. The structured regions 5a are embodied as depressions, in particular in the form of elongated trenches. In the exemplary embodiment in FIG. 6, the depressions have interruptions. The depressions of the second orientation run through the interruptions of the depressions of the first orientation. In the exemplary embodiment in FIG. 7, the depressions are continuous, such that the depressions of the first orientation and the depressions of the second orientation intersect.

Figure 8A:
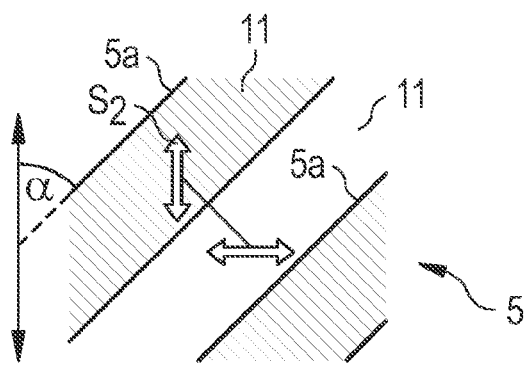
Figure 8B:
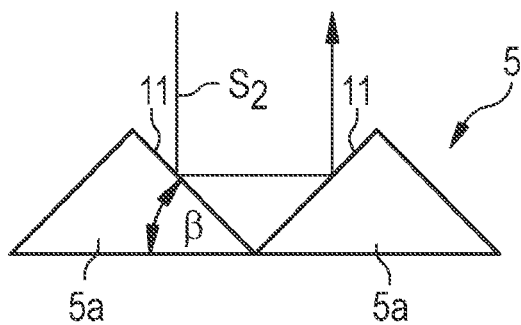

FIG. 8A shows a further exemplary embodiment of an optical structure 5 in a plan view of the semiconductor chip. FIG. 8B illustrates the side view in this respect. The optical structure 5 comprises structured regions 5a embodied as prisms. By way of example, the prisms can be etched into the semiconductor body.

The prisms are arranged parallel to one another. Furthermore, the prisms run transversely with respect to the grating regions of the grating structure (not illustrated) and form therewith the angle α of greater than 0° and less than 90°, preferably of 45° (cf. FIG. 8A). The prisms have oblique side faces 11 (cf. FIG. 8B). These run at an angle β of greater than 0° and less than 90°, preferably of 45°, obliquely with respect to a plane in which the grating structure extends. Advantageously, the polarization of the impinging radiation component S2 can be rotated by reflection at two opposite side faces 11 of two adjacent structured regions 5a. In particular, the parallel polarized radiation is converted into perpendicularly polarized radiation by the optical structure 5.

It should be pointed out that the described exemplary embodiments of an optical structure can in each case be combined with the different exemplary embodiments of a grating structure. Furthermore, the invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:
1. A radiation-emitting semiconductor chip comprising:
   a semiconductor body comprising an active zone configured to emit unpolarized radiation having a first radiation component of a first polarization and a second radiation component of a second polarization;
   a grating structure configured to act as a waveplate or polarization filter and bring about an increase in one radiation component relative to the other radiation component in the radiation emitted by the semiconductor chip through a coupling-out side such that the semiconductor chip is configured to emit polarized radiation having the polarization of the amplified radiation component while the attenuated radiation component remains in the semiconductor chip;

an optical structure configured to convert the polarization of at least a part of the attenuated radiation component remaining in the semiconductor chip into the polarization of the amplified radiation component; and a reflective rear side situated opposite the coupling-out side, wherein the optical structure comprises a first group of structured regions and at least a second group of structured regions, wherein each group of structured regions comprises at least one structured region having oblique side faces that run at an angle of greater than 0° and less than 90° obliquely with respect to a plane in which the grating structure extends, wherein each group of structured regions comprises at least two of the structured regions, wherein the structured regions of one group of structured regions directly adjoin each other, and wherein the first group of structured regions and the second group of structured regions are laterally spaced apart from each other.

2. The radiation-emitting semiconductor chip according to claim 1, wherein the grating structure comprises a plurality of alternately arranged first grating regions of a first material and second grating regions of a second material, and wherein the grating regions of the same material are at a distance from one another which is smaller than a wavelength of the radiation generated by the active zone.

3. The radiation-emitting semiconductor chip according to claim 2, wherein the first and second grating regions are embodied in strip-type fashion and are arranged parallel to one another.

4. The radiation-emitting semiconductor chip according to claim 2, wherein the first or second grating regions of the grating structure acting as a waveplate are formed from a material that is transmissive to the radiation generated in the active zone, wherein the material comprises $SiO_2$, GaAs, AlGaAs, InGaAlP or GaN.

5. The radiation-emitting semiconductor chip according to claim 1, wherein the first radiation component experiences a different phase shift than the second radiation component upon transmission through the grating structure acting as a waveplate.

6. The radiation-emitting semiconductor chip according to claim 5, wherein the grating structure acting as a waveplate is arranged between the active zone and the reflective rear side of the semiconductor chip, and wherein a distance between the active zone and the reflective rear side is set in such a way that, as a result of interference of radiation of the same polarization, one radiation component is amplified and the other radiation component is attenuated.

7. The radiation-emitting semiconductor chip according to claim 2, wherein the first grating regions of the grating structure acting as a polarization filter comprise a metal.

8. The radiation-emitting semiconductor chip according to claim 7, wherein one radiation component is transmitted at the grating structure acting as a polarization filter and the other radiation component is reflected.

9. The radiation-emitting semiconductor chip according to claim 7, wherein the grating structure acting as a polarization filter is arranged on a surface of the semiconductor body that is on the coupling-out side.

10. The radiation-emitting semiconductor chip according to claim 7, wherein the grating structure is a contact structure for current spreading.

11. The radiation-emitting semiconductor chip according to claim 2, wherein the optical structure comprises structured regions extending in a plane arranged parallel to a plane in which the grating structure extends, wherein the structured regions run transversely with respect to the grating regions and form with the latter an angle of greater than 0° and less than 90°.

12. The radiation-emitting semiconductor chip according to claim 11, wherein the structured regions run transversely with respect to the grating regions and form with the latter an angle of 45°.

13. The radiation-emitting semiconductor chip according to claim 11, wherein the structured regions are arranged at least partly parallel to one another.

14. The radiation-emitting semiconductor chip according to claim 1, wherein the optical structure comprises structured regions having oblique side faces that run at an angle of 45° obliquely with respect to a plane in which the grating structure extends.

15. The radiation-emitting semiconductor chip according to claim 1, wherein the structured regions are embodied as prisms or pyramids.

16. The radiation-emitting semiconductor chip according to claim 1, wherein the reflective rear side comprises the optical structure.

17. The radiation-emitting semiconductor chip according to claim 1, wherein a part of the semiconductor body is arranged between the first group and the second group of structured regions.

* * * * *